US012791404B2

(12) United States Patent
Laddy-Locks

(10) Patent No.: US 12,791,404 B2
(45) Date of Patent: Nov. 10, 2026

(54) NON-DESTRUCTIVE THERMOCOUPLE CONTACT TESTING TOOL AND METHOD

(71) Applicant: RTX Corporation, Farmington, CT (US)

(72) Inventor: Spencer Ean Laddy-Locks, East Haddam, CT (US)

(73) Assignee: RTX Corporation, Farmington, CT (US)

( * ) Notice: Subject to any disclaimer, the term of this patent is extended or adjusted under 35 U.S.C. 154(b) by 351 days.

(21) Appl. No.: 18/665,201

(22) Filed: May 15, 2024

(65) Prior Publication Data

US 2025/0354878 A1 Nov. 20, 2025

(51) Int. Cl.

| | |
|---|---|
| ***G01R 31/68*** | (2020.01) |
| ***G01K 7/02*** | (2021.01) |
| ***G01K 15/00*** | (2006.01) |
| ***G01R 31/69*** | (2020.01) |
| ***H10N 10/13*** | (2023.01) |

(52) U.S. Cl.

CPC ........... *G01K 15/007* (2013.01); *G01K 7/023* (2013.01); *G01K 15/002* (2013.01); *G01R 31/68* (2020.01); *G01R 31/69* (2020.01); *H10N 10/13* (2023.02)

(58) Field of Classification Search

CPC ...... G01K 7/023; G01K 7/026; G01K 15/002; G01K 15/023; G01K 15/007; G01R 31/68; G01R 31/69; H10N 10/13

See application file for complete search history.

(56) References Cited

U.S. PATENT DOCUMENTS

2008/0133170 A1* 6/2008 Engelstad ................ G01K 7/16 374/E7.018

FOREIGN PATENT DOCUMENTS

| | | |
|---|---|---|
| CN | 109613051 B | 8/2021 |
| EP | 1007952 B1 | 10/2004 |
| EP | 2102616 B1 | 1/2018 |

OTHER PUBLICATIONS

European Search Report dated Sep. 26, 2025, in connection with European Application No. 25176833.9, 10 pages.

Dwyeromega, "How to test a thermocouple with a meter (grounded & ungrounded)," YouTube Video, https://www.youtube.com/watch?v=3_1wLOuxr0Y, Jan. 2019, 1 page.

* cited by examiner

*Primary Examiner* — Randy W Gibson

(57) ABSTRACT

An apparatus for testing a thermocouple contact comprises a first nondestructive connector removably connected to a known contact of a thermocouple contact assembly and a second nondestructive connector removably connected to an unknown contact of the thermocouple assembly. A processing device is electrically connected to the first nondestructive connector and the second nondestructive connector. Responsive to connection of the thermocouple contact assembly between the first nondestructive connector and the second nondestructive connector and application of a heat source to the thermocouple contact assembly a Seebeck voltage is measured by the processing device.

20 Claims, 5 Drawing Sheets

NON-DESTRUCTIVE THERMOCOUPLE CONTACT TESTING TOOL AND METHOD

TECHNICAL FIELD

This disclosure relates generally to thermocouple contacts. More specifically, this disclosure relates to a non-destructive system and method for testing thermocouple contacts before they are inserted into connectors.

BACKGROUND

A thermocouple is an electrical device consisting of two dissimilar electrical conductors forming an electrical junction. A thermocouple produces a temperature-dependent voltage as a result of the Seebeck effect. The Seebeck effect generates a voltage potential as a function of differential temperature between the junction and voltage measurement location. This Seebeck voltage can be interpreted to measure the junction temperature. Commercial thermocouples are inexpensive, interchangeable, and are often used with standard connectors. The contacts that are inserted into a thermocouple connector can, on occasion, be defective due to incorrect material composition and/or magnetization. When thermocouple connectors are implemented, defects in any of the thermocouple connector contacts may not be detected until the connector is entirely assembled and tested. This would then require the removal and replacement of one or more of the thermocouple connector contacts to correct the problem. Since these connectors can have many channels, this becomes a time-consuming process, and one which does not guarantee the replacement contact(s) are "good", thus creating a non-deterministic path for success.

Thus, some manner for validating the behavior of thermocouple connector contacts prior to installation within a connector would greatly increase the efficiency of the manufacturing process and mitigate escapes. Existing methods for testing thermocouple connectors often involved crimping of the connector contacts which voids its usability after the test has been performed. Thus, there is a need for a nondestructive system and method for testing a thermocouple connector contact that will enable the passed contacts to be used within a manufactured product after the testing process.

SUMMARY

This disclosure relates to nondestructively testing contacts of a thermocouple connector before they are installed.

One general aspect includes an apparatus for testing a thermocouple connector contact. The apparatus also includes a first nondestructive connector removably connected to a known contact of a thermocouple contact assembly, a second nondestructive connector removably connected to an unknown contact of the thermocouple contact assembly and a processing device electrically connected to the first nondestructive connector and the second nondestructive connector, where responsive to connection of the thermocouple contact assembly between the first nondestructive connector and the second nondestructive connector and application of a heat source to the thermocouple contact assembly, any Seebeck voltage is measured by the processing device.

Implementations may include one or more of the following features. The apparatus where the processing device further: determines that the Seebeck voltage has varied by more than a predetermined amount; and determines that the unknown contact is a bad contact responsive to the determination that the Seebeck voltage has varied by more than the predetermined amount. The processing device further: determines that the Seebeck voltage has remained substantially unchanged; and determines that the unknown contact is a good contact responsive to the determination that the Seebeck voltage has remained substantially unchanged. The first nondestructive connector and the second nondestructive connector may include alligator clips. The apparatus may include a mechanical actuator for simultaneously opening the first nondestructive connector and the second nondestructive connector to receive the nondestructively and removably mated thermocouple contact assembly having the known contact and the unknown contact therein. The apparatus may include: a first copper wire for interconnecting the first nondestructive connector to the processing device, and a second copper wire for interconnecting the second nondestructive connector to the processing device. The known contact may include a thermocouple contact of a known material. Implementations of the described techniques may include hardware, a method or process, or computer software on a computer-accessible medium.

Another general aspect includes a method for testing a thermocouple connector contact. The method also includes removably connecting a known contact of a thermocouple contact assembly to a first nondestructive connector of a testing device, removably connecting an unknown contact of the thermocouple contact assembly to a second nondestructive connector of the testing device, applying a heat source to the thermocouple contact assembly removably connected to the first nondestructive connector and the second nondestructive connector, measuring a Seebeck voltage across the thermocouple contact assembly using a processing device electrically connected to the first nondestructive connector and the second nondestructive connector responsive to the applied heat source, and determining whether the unknown contact is a good contact or a bad contact responsive to the measured Seebeck voltage using the processing device electrically connected to the first nondestructive connector and the second nondestructive connector.

Implementations may include one or more of the following features. The method where the step of determining further may include determining that the Seebeck voltage has varied by more than a predetermined amount; and determining that the unknown contact is a bad contact responsive to the determination that the Seebeck voltage has varied by more than the predetermined amount. The step of determining further may include determining that the Seebeck voltage has remained substantially unchanged; and determining that the unknown contact is a good contact responsive to the determination that the Seebeck voltage has remained substantially unchanged. The first nondestructive connector and the second nondestructive connector may include alligator clips. The method may include simultaneously opening the first nondestructive connector and the second nondestructive connector using a mechanical actuator and receiving the thermocouple contact assembly having the known contact and the unknown contact non-destructively and removably mated therein. The method may include interconnecting the first nondestructive connector to the processing device using a first copper wire and interconnecting the second nondestructive connector to the processing device using a second copper wire. The known contact may include a thermocouple contact of a known material. Implementations of the described techniques may include hardware, a method or process, or computer software on a computer-accessible medium.

A further general aspect includes an apparatus for testing a thermocouple connector contact. The apparatus also includes a first alligator clip connector for removably connecting to a known contact of a thermocouple contact assembly, a second alligator clip connector removably connecting to an unknown contact of the thermocouple contact assembly and a processing device electrically connected to the first alligator clip connector and the second alligator clip connector, where responsive to connection of the thermocouple contact assembly between the first alligator clip connector and the second alligator clip connector and application of a heat source to the thermocouple contact assembly a Seebeck voltage is measured by the processing device, further where the processing device determines whether the unknown contact is a bad contact or a good contact responsive to the measured Seebeck voltage.

Implementations may include one or more of the following features. The apparatus where the processing device further: determines that the Seebeck voltage has varied by more than a predetermined amount; and determines that the unknown contact is a bad contact responsive to the determination that the Seebeck voltage has varied by more than the predetermined amount. The processing device further: determines that the Seebeck voltage has remained substantially unchanged; and determines that the unknown contact is a good contact responsive to the determination that the Seebeck voltage has remained substantially unchanged. The apparatus may include a mechanical actuator for simultaneously opening the first alligator clip connector and the second alligator clip connector to receive the thermocouple contact assembly having the known contact and the unknown contact non-destructively and removably mated therein. The apparatus may include: a first copper wire for interconnecting the first alligator clip connector to the processing device, and a second copper wire for interconnecting the second alligator clip connector to the processing device. The known contact may include a thermocouple contact of a known material. Implementations of the described techniques may include hardware, a method or process, or computer software on a computer-accessible medium.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description taken in conjunction with the accompanying drawings, in which like reference numerals represent like parts.

DETAILED DESCRIPTION

FIGS. 1 through 7, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

Figure 1:
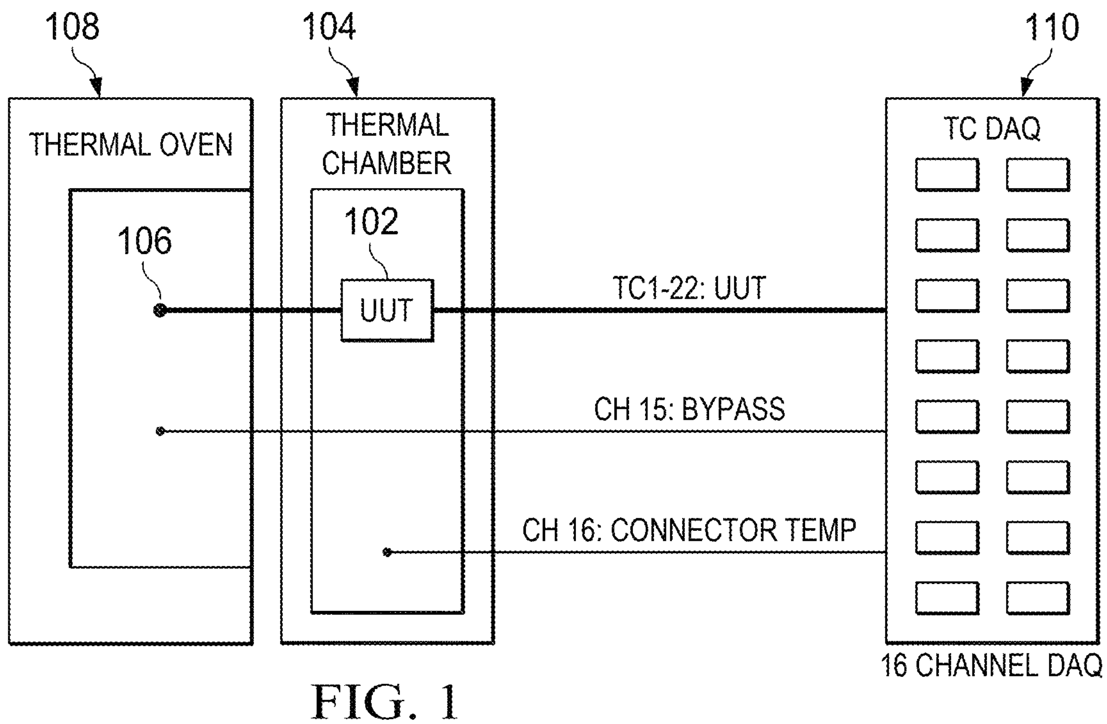
FIG. 1 illustrates a thermocouple testing system wherein thermocouple contacts are implemented within a unit under test (UUT) within a thermal chamber.

Referring now to FIG. 1, there is illustrated a testing configuration for a unit under test (UUT) 102 within a thermal chamber 104. The unit under test 102 includes thermocouple contacts associated with a bundle of thermocouple junctions 106 that is inserted within a thermal oven 108. The UUT 102 is connected to a data acquisition card 110. The data acquisition card 110 also receives input from a bypass channel connected to the thermal oven 108 and a temperature probe within the thermal chamber 104. The UUT 102 is comprised of Chromel and Alumel contacts. In order for the thermocouples to operate properly, the Chromel and Alumel contacts must be made of the correct composition of materials. The UUT 102 is comprised of both male and female contacts. Both of these types of contacts may be tested in accordance with the below described system and method. Furthermore, while the embodiments described herein relate to the use of thermocouple contacts comprised of Chromel and Alumel, contacts constructed of alternative thermocouple materials may also be utilized.

Figure 2:
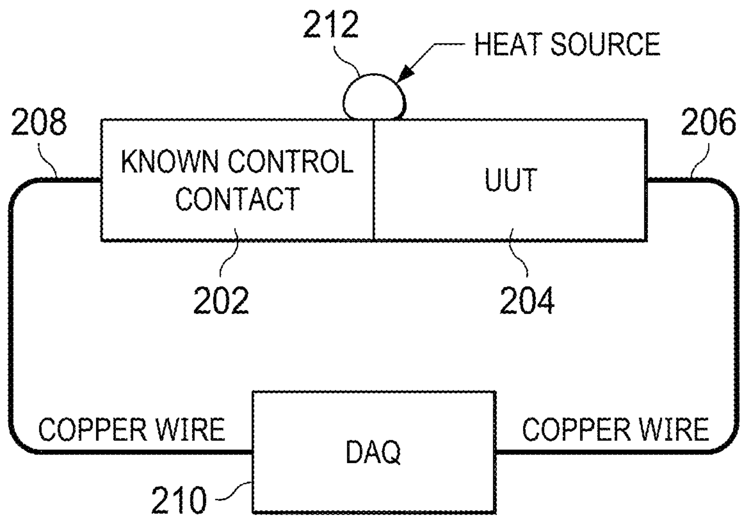
FIG. 2 illustrates a system for testing a thermocouple connector contact.

Referring now to FIG. 2, there is illustrated a diagram of the device for nondestructive testing of thermocouple contacts. The apparatus comprises a known contact 202 (acting as a control contact) that is paired with an unknown contact 204. The known contact 202 may comprise any type of thermocouple contact made of either Chromel material or Alumel material. Additionally, the known contact 202 may comprise either a male or female type contact of either material. The known contact 202 must be a known good contact that does not have any material or magnetization issues. The unknown contact 204 that is paired with the known contact 202 must be of the same composition material (Chromel or Alumel) and must be the opposite gender of the known contact 202. Thus, if the known contact 202 is a male contact (also called pin) the unknown contact 204 must be a female contact (also called socket). Similarly, if the known contact 202 is a female contact the unknown contact 204 must be a male contact.

The known contact 202 and the unknown contact 204 are connected to each other in the known manner (i.e., male to female insertion). The opposite ends of each of the known contact 202 and unknown contact 204 are connected to copper wires 206 and 208, respectively. The connection between the known contact 202 and the copper wire 208 is a nondestructive, removable connection which enables the known contact to be removably connected thereto. Similarly, the connection between the unknown contact 204 and the copper wire 206 comprises the same type of nondestructive, removable connection. In one embodiment, more particularly illustrated in FIG. 3, the connection to the ends of the known contact 202 and the unknown contacts 204, respectively, comprise a pair of alligator clips 302. The alligator clips 302 are opened simultaneously using some type of opening mechanism 304 and the interconnected known contact 202 and the unknown contact 204 of the thermocouple contact assembly are placed between the jaws of the open alligator clips 302. A support pedestal 306 may be used to support the connected known contact 202 and unknown contact 204 at a predetermined level in order to enable the alligator clip jaws to appropriately connect to the ends of the assembled thermocouple contacts. The alligator clip 302 connected to the known contact 202 connects with copper wire 208 and alligator clip 302 connected to the unknown contact 204 is connected to copper wire 206.

Figure 3:
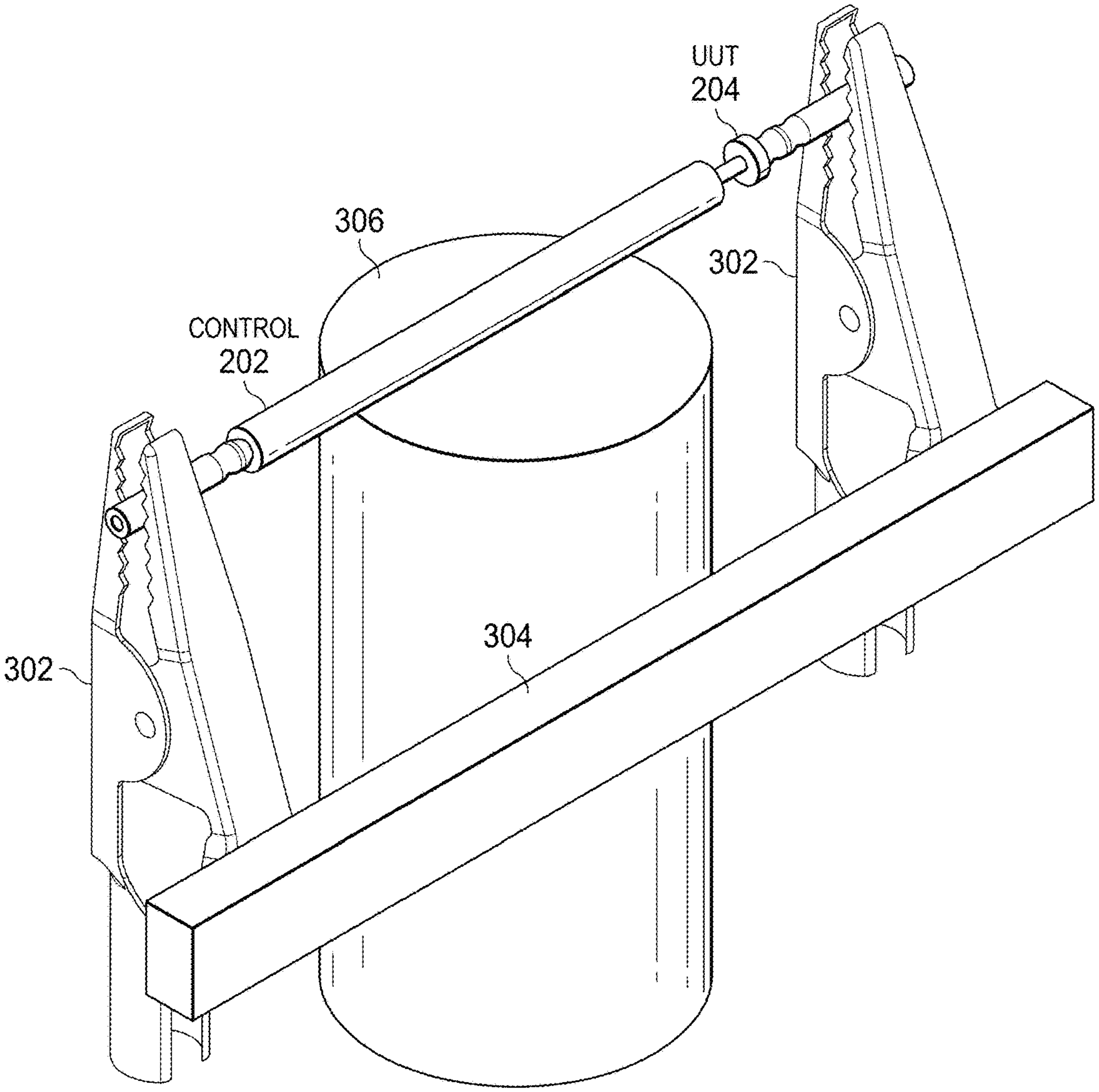
FIG. 3 illustrates an embodiment of the mechanism for securing a thermocouple contact assembly under test.

By utilizing the alligator clips 302 to connect to the known control contact 202 and the unknown contact 204 the contacts are not destroyed and may be installed in a further device. Once the test is completed, the known contact 202 and the unknown contact 204 may be used within a thermocouple contact assembly and permanently connected to another wire since the contacts were not previously connected to the copper wires 208 and 206 but only temporarily so using the alligator clips 302. Additionally, while the embodiment illustrated with respect to FIG. 3 shows the use of alligator clips 302, it will be appreciated that other manners for temporarily connecting to the known control contact 202 and unknown contact 204 may be utilized as long as the integrity of the contact is not destroyed by the connection in a similar manner to that achieved by the alligator clips 302.

Referring now back to FIG. 2, the copper wire 208 from the known control contact 202 and the copper wire 206 from the unknown contact 204 are each connected to a data acquisition card (DAQ) 210. The copper wires 208 and 206 are twisted pairs. Twisted pair wires reduce the chance of noise being introduced into the signal. The DAQ 210 is used for monitoring for a detectable Seebeck voltage that may occur responsive to providing a heat source 212 to the interconnection point between the known contact 202 and the unknown contact 204. The DAQ 210 comprise a processing device that is able to measure the Seebeck voltage across a thermocouple contact assembly and records the voltage. Based upon the recorded voltage, monitoring software or a user can determine if the unknown contact passes or fails. In one embodiment, the heat source 212 may comprise a soldering iron. However, any device capable of applying adequate heat to the center connection point of the known contact 202 and the unknown contact 204 may be utilized.

Figure 4:
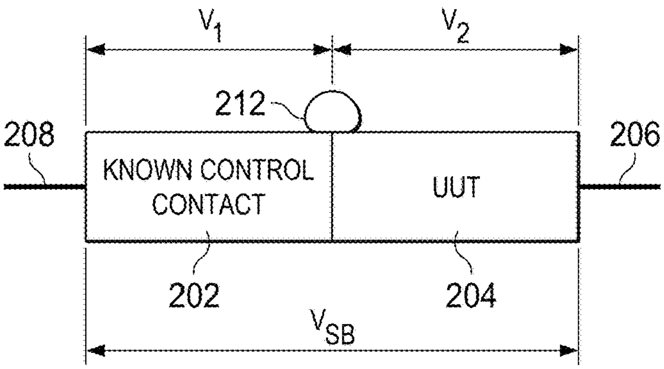
FIG. 4 illustrates the voltages involved in testing the behavior of a thermocouple contact assembly.

The voltages created by applying the heat source 212 to the thermocouple contact assembly with respect to testing the operational state of the unknown contact 204 is more particularly illustrated with respect to FIG. 4. FIG. 4 illustrates the various voltages that may occur over the thermocouple contact assembly responsive to application of the heat source 212 thereto. As discussed previously, the thermocouple contact assembly comprises the known contact 202 that is interconnected with the unknown contact 204. The known contact 202 connects with copper wire 208 and the unknown contact 204 connects with copper wire 206. When a heat source 212 is applied to the center of the thermocouple contact assembly this will create a temperature differential between each of the ends of the thermocouple contacts where they connect with the copper wires 208 and 206, respectively, and the center of the thermocouple contact assembly where the heat source is applied. If the known contact 202 comprises the same material as the unknown contact 204, this will cause the Seebeck voltage $V_{SB}$ between the ends of the thermocouple contact assembly to be substantially zero as the voltage $V_1$ induced between the end of the known contact 202 and the center of the thermocouple contact assembly will cancel out the voltage $V_2$ induced between the end of the unknown contact 204 and the center of the thermocouple contact assembly (i.e. the unknown contact is good).

If the known contact 202 and the unknown contact 204 comprise different materials (i.e. the unknown contact is bad) then voltage $V_1$ will not equal voltage $V_2$ and the Seebeck voltage $V_{SB}$ will indicate a voltage rise or drop since the voltages $V_1$ and $V_2$ do not cancel each other out. The indication of whether the unknown contact 204 is good or bad based on the Seebeck voltage $V_{SB}$ that is measured and recorded by the data acquisition card 210 that is connected to the copper wires 208 and 206 is made by monitoring software or a monitoring user.

Figure 5:
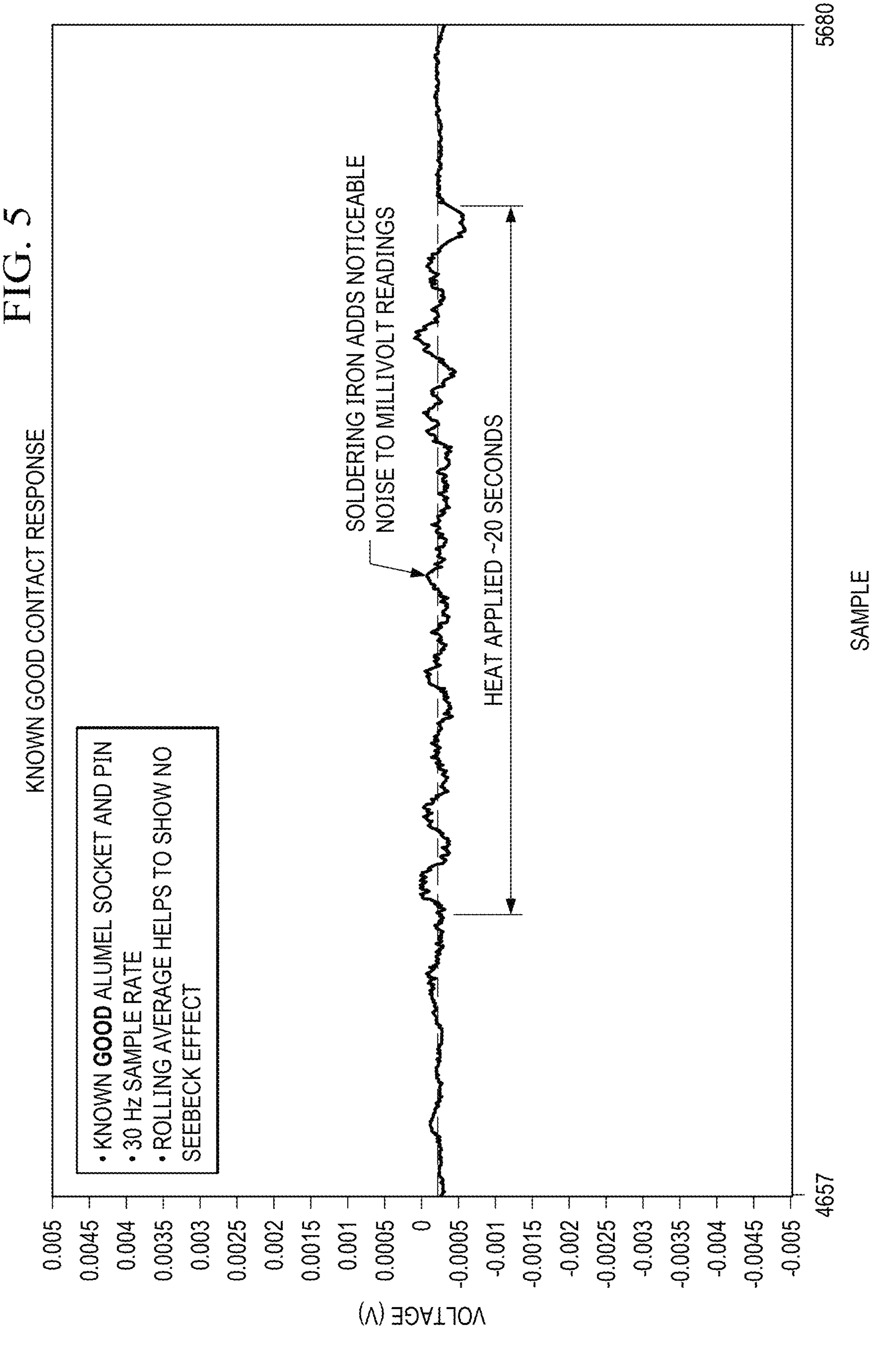
FIG. 5 illustrates a voltage response of a good thermocouple contact.

FIG. 5 illustrates the monitored Seebeck voltage $V_{SB}$ responsive to application of a heat source 212 to the thermocouple contact assembly when the unknown contact 204 is a good contact. As can be seen, when the heat is applied for approximately 20 seconds, the signal maintains a relatively constant value with the only changes in the voltage being those caused by the noise inserted by the application of the heat source 212. As can be seen, there is no significant increase or decrease in the Seebeck voltage thus indicating the unknown contact 204 is good.

Figure 6:
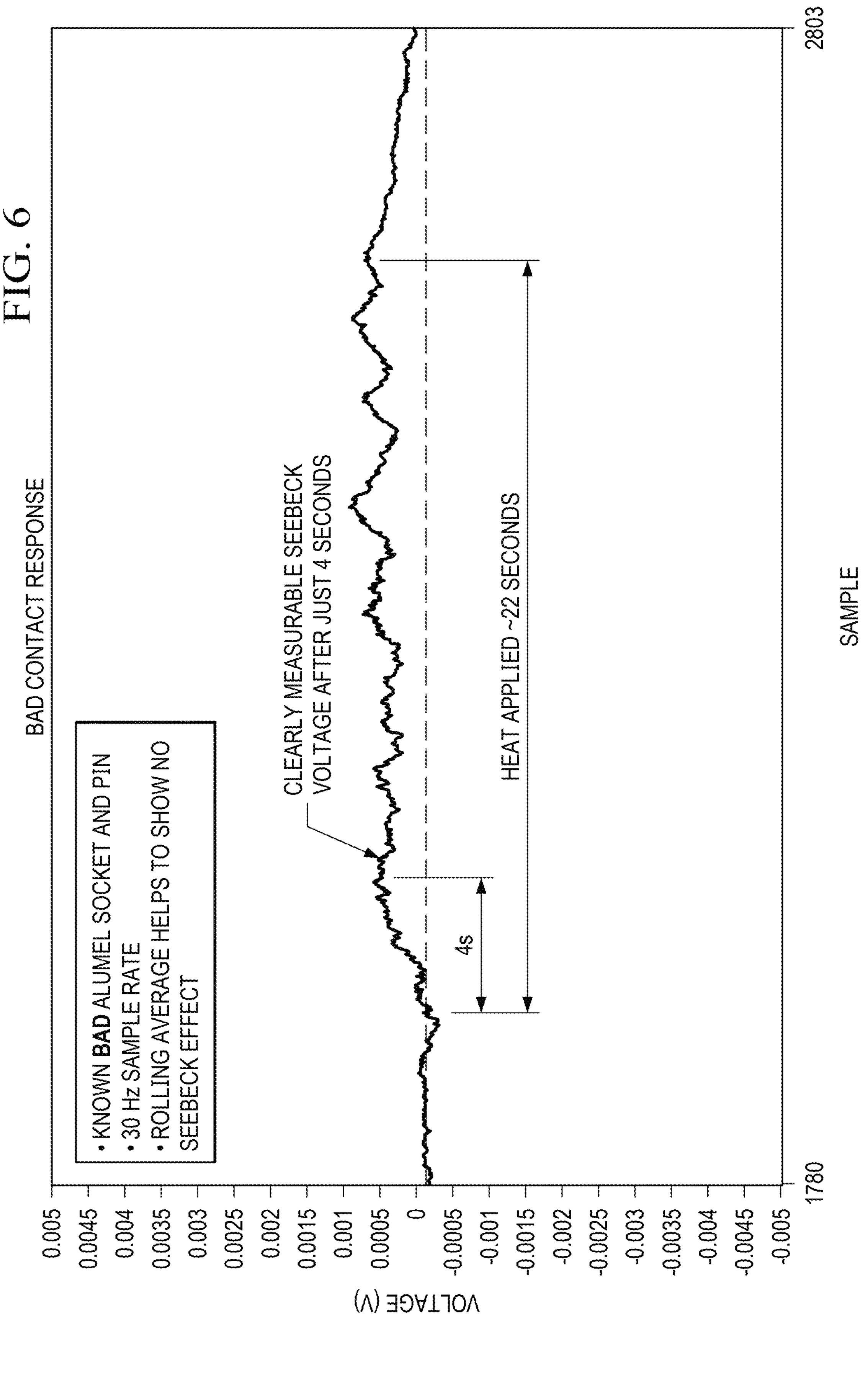
FIG. 6 illustrates a voltage response of a bad thermocouple contact.

FIG. 6 illustrates the monitored Seebeck voltage $V_{SB}$ responsive to the application of heat source 212 to the thermocouple contact assembly when the unknown contact is a bad contact. As can be seen, when the heat is applied for approximately 22 seconds, there is a measurable increase in the Seebeck voltage $V_{SB}$ after approximately four seconds. This increase is maintained over the entire period of application of the heat source 212. When the heat source 212 is removed after approximately 22 seconds, the Seebeck voltage can be seen to return toward zero. While the illustration with respect to the bad unknown contact 204 of FIG. 6 shows the Seebeck voltage $V_{SB}$ to increase to indicate the bad contact, it will be appreciated that depending upon the characteristics of the bad unknown contact 204, the Seebeck voltage $V_{SB}$ could also decrease to measurable negative voltage levels in order to indicate a bad contact.

Thus, as can be seen with respect to FIGS. 5 and 6, an unknown contact of various types may be easily tested using the described system to nondestructively and quickly determine whether a particular contact is a good contact or a bad contact. This will prevent the need from assembling contacts within a larger electrical connector and then testing the harness to determine if there is a problem with one or more of the thermocouple contacts therein. This can provide a great deal of improvement in the assembly and testing process of electrical connectors including thermocouples.

Figure 7:
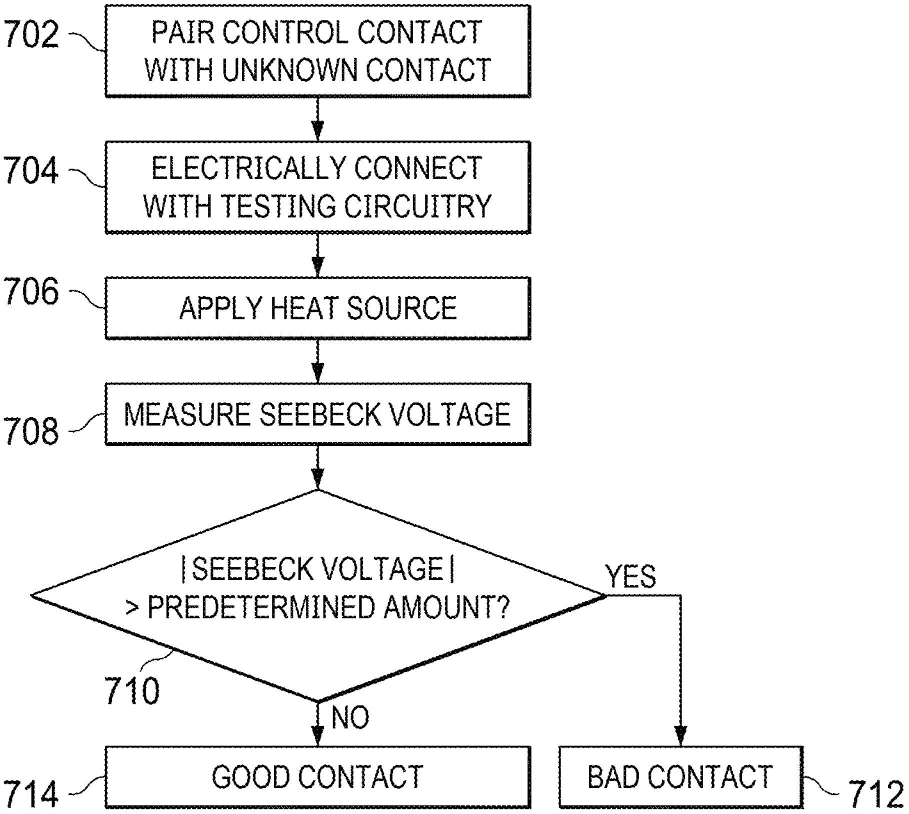
FIG. 7 illustrates a flow diagram of the process for nondestructive testing of a thermocouple contact.

Referring now to FIG. 7, there is illustrated the process for determining whether a thermocouple contact is a good contact or bad contact utilizing the system described hereinabove. Initially, a known contact 202 is paired with an unknown contact 204 at step 702. The known contact 202 must comprise a known good contact in order to test the behavior of the unknown contact 204. The known and unknown contact are connected with each other and then electrically connected with the testing circuitry at step 704. Electrical connection involves connecting of the end of the known contact 202 and the unknown contact 204 with the nondestructive electrical connectors as described hereinabove. In the described embodiment, the known nondestructive electrical connectors comprise alligator clips 302.

Once the assembled thermocouple contact assembly has been connected to the nondestructive electrical connectors, a heat source is applied to the center of the thermocouple contact assembly at step 706. The data acquisition card 210 that is connected to the thermocouple contact assembly may then measure the Seebeck voltage across the thermocouple contact assembly at step 708. Based upon the measured Seebeck voltage from step 708, inquiry step 710 determines if the absolute value of the measured Seebeck voltage is greater than a predetermined amount. If the Seebeck voltage deviated more than the predetermined amount, then a bad contact is indicated at step 712. If no measurable increase or decrease in the Seebeck voltage is detected at inquiry step 710 then a good contact is indicated at step 714.

This nondestructive quality control testing of thermocouple contacts provides a manner for quickly and easily determining whether a particular individual contact is a good contact or a bad contact. This determination may be made in a nondestructive fashion without requiring the complete assembly of an electrical wiring harness including thermocouples and then testing the overall electrical wiring harness to determine if there are issues with one or more of the thermocouple contacts therein. This will provide a great time savings in electrical wiring harness assembly.

It may be advantageous to set forth definitions of certain words and phrases used throughout this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112 (f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112 (f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus for testing a thermocouple contact, comprising:

a first nondestructive connector removably connected to a known contact of a thermocouple contact assembly;

a second nondestructive connector removably connected to an unknown contact of the thermocouple contact assembly; and a processing device electrically connected to the first nondestructive connector and the second nondestructive connector, wherein responsive to connection of the thermocouple contact assembly, between the first nondestructive connector and the second nondestructive connector and application of a heat source to the thermocouple contact assembly a Seebeck voltage is measured by the processing device.

2. The apparatus of claim 1, wherein the processing device is further configured to:

determine that the Seebeck voltage has varied by more than a predetermined amount; and determine that the unknown contact is a bad contact responsive to the determination that the Seebeck voltage has varied by more than the predetermined amount.

3. The apparatus of claim 1, wherein the processing device is further configured to:

determine that the Seebeck voltage has remained substantially unchanged; and determine that the unknown contact is a good contact responsive to the determination that the Seebeck voltage has remained substantially unchanged.

4. The apparatus of claim 1, wherein the first nondestructive connector and the second nondestructive connector comprise alligator clips.

5. The apparatus of claim 1 further comprising a mechanical actuator for simultaneously opening the first nondestructive connector and the second nondestructive connector to receive the thermocouple contact assembly having the known contact and the unknown contact nondestructively and removably mated therein.

6. The apparatus of claim 1, further comprising:

a first copper wire for interconnecting the first nondestructive connector to the processing device; and a second copper wire for interconnecting the second nondestructive connector to the processing device.

7. The apparatus of claim 1, wherein the known contact comprises a thermocouple contact of a known material.

8. A method for testing a thermocouple contact, comprising:

removably connecting a known contact of a thermocouple contact assembly to a first nondestructive connector of a testing device;

removably connecting an unknown contact of the thermocouple contact assembly to a second nondestructive connector of the testing device;

applying a heat source to the thermocouple contact assembly removably connected to the first nondestructive connector and the second nondestructive connector;

measuring a Seebeck voltage across the thermocouple contact assembly using a processing device electrically connected to the first nondestructive connector and the second nondestructive connector responsive to the applied heat source; and determining whether the unknown contact is a good contact or a bad contact responsive to the measured Seebeck voltage using the processing device electrically connected to the first nondestructive connector and the second nondestructive connector.

9. The method of claim 8, wherein the step of determining further comprises:

determining that the Seebeck voltage has varied by more than a predetermined amount; and determining that the unknown contact is a bad contact responsive to the determination that the Seebeck voltage has varied by more than the predetermined amount.

10. The method of claim 8, wherein the step of determining further comprises:

determining that the Seebeck voltage has remained substantially unchanged; and determining that the unknown contact is a good contact responsive to the determination that the Seebeck voltage has remained substantially unchanged.

11. The method of claim 8, wherein the first nondestructive connector and the second nondestructive connector comprise alligator clips.

12. The method of claim 8, further comprising:

simultaneously opening the first nondestructive connector and the second nondestructive connector using a mechanical actuator; and receiving the thermocouple contact assembly having the known contact and the unknown contact nondestructively and removably mated therein.

13. The method of claim 8, further comprising:

interconnecting the first nondestructive connector to the processing device using a first copper wire; and interconnecting the second nondestructive connector to the processing device using a second copper wire.

14. The method of claim 8, wherein the known contact comprises a thermocouple contact of a known material.

15. An apparatus for testing a thermocouple contact, comprising:

a first alligator clip connector for removably connecting to a known contact of a thermocouple contact assembly;

a second alligator clip connector removably connecting to an unknown contact of the thermocouple contact assembly; and a processing device electrically connected to the first alligator clip connector and the second alligator clip connector, wherein responsive to connection of the thermocouple contact assembly between the first alligator clip connector and the second alligator clip connector and application of a heat source to the thermocouple contact assembly a Seebeck voltage is measured by the processing device, further wherein the processing device determines whether the unknown contact is a bad contact or a good contact responsive to the measured Seebeck voltage.

16. The apparatus of claim 15, wherein the processing device is further configured to:

determine that the Seebeck voltage has varied by more than a predetermined amount; and determine that the unknown contact is a bad contact responsive to the determination that the Seebeck voltage has varied by more than the predetermined amount.

17. The apparatus of claim 15, wherein the processing device is further configured to:

determine that the Seebeck voltage has remained substantially unchanged; and determine that the unknown contact is a good contact responsive to the determination that the Seebeck voltage has remained substantially unchanged.

18. The apparatus of claim 15, further comprising a mechanical actuator for simultaneously opening the first alligator clip connector and the second alligator clip connector to receive the thermocouple contact assembly having the known contact and the unknown contact nondestructively and removably mated therein.

19. The apparatus of claim 15, further comprising:

a first copper wire for interconnecting the first alligator clip connector to the processing device; and a second copper wire for interconnecting the second alligator clip connector to the processing device.

20. The apparatus of claim 15, wherein the known contact comprises a thermocouple contact of a known material.

* * * * *